United States Patent
Nguyen et al.

(10) Patent No.: US 7,376,032 B2
(45) Date of Patent: May 20, 2008

(54) METHOD AND APPARATUS FOR A DUMMY SRAM CELL

(75) Inventors: Lam Van Nguyen, Cupertino, CA (US); Quan Nguyen, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 182 days.

(21) Appl. No.: 11/421,497

(22) Filed: Jun. 1, 2006

(65) Prior Publication Data

US 2007/0280022 A1    Dec. 6, 2007

(51) Int. Cl.
*G11C 7/02* (2006.01)
(52) U.S. Cl. ............... 365/210; 365/214; 365/189.09
(58) Field of Classification Search ............ 365/210, 365/214, 189.09
See application file for complete search history.

(56) References Cited

U.S. PATENT DOCUMENTS

| | | | |
|---|---|---|---|
| 5,091,879 A * | 2/1992 | Tran | 365/177 |
| 6,373,745 B2 * | 4/2002 | Saito et al. | 365/174 |
| 6,717,842 B2 * | 4/2004 | Watanabe et al. | 365/154 |
| 7,161,859 B2 * | 1/2007 | Sumitani et al. | 365/203 |
| 2004/0027852 A1 * | 2/2004 | Watanabe et al. | 365/154 |
| 2007/0263447 A1 * | 11/2007 | Koike et al. | 365/185.18 |

* cited by examiner

*Primary Examiner*—Tuan T. Nguyen
(74) *Attorney, Agent, or Firm*—Thomas Rouse; Nicholas J. Pauley; Joseph B. Agusta

(57) ABSTRACT

A dummy SRAM cell for use in a dummy bit line circuit uses the same transistors as used in a standard SRAM cell, which includes first and second subsets of transistors configured as first and second bit line output circuits. The dummy SRAM cell includes the same first and second subsets of transistors, with the first transistors configured as a dummy bit line output circuit having substantially the same electrical characteristics as the first bit line output circuit of the standard SRAM cell. Further, the second transistors, which are not otherwise needed for the dummy SRAM cell function, are reconfigured as a voltage tie circuit for the dummy bit line output. Using the second transistors for this purpose obviates the need to add additional transistors to form a voltage tie circuit for configuring the dummy bit line output circuit as a load or driver for the dummy bit line.

14 Claims, 4 Drawing Sheets

METHOD AND APPARATUS FOR A DUMMY SRAM CELL

FIELD

The present disclosure generally relates to memories, and particularly relates to Static Random Access Memories, more commonly referred to as SRAMs.

BACKGROUND

SRAMS, especially high-density SRAMs utilizing small device geometries, generally incorporate sense amplifiers to provide the output drive capability for memory reads. Each sense amplifier detects the differential voltage across a corresponding pair of complementary bit lines (BL and BL') in an SRAM array. Outputting correctly sensed bit data from the memory array depends on sense amplifier settling times, which in turn depend on a number of process-related and environmental variables.

For example, the effective capacitance of each SRAM cell, and the number of SRAM cells (rows) connected to the bit lines, influences the charge and discharge times of the bit lines and therefore influences the settling time for reliably sensing differential bit line voltages via the sense amplifiers. Cell capacitance varies with variations in the process—e.g., variations in metallization layer widths—and, more generally, the overall circuit timing changes with process, temperature, and voltage variations.

Designers address read timing variations in a number of ways. One conventional approach generates read clock timing via circuitry that tracks changes in the actual SRAM array. For example, a designer may implement a "dummy" bit line that is loaded with additional SRAM cells that are not part of the actual memory array. By using the same SRAM cells and design rules as the actual bit lines, the charge/discharge times of the dummy bit line proportionally track those of the real bit lines. As such, using the dummy bit line in read clock generation automatically compensates for timing changes in the SRAM array.

However, the use of dummy bit lines is not without certain disadvantages. For example, common existing and developing process technologies do not permit the direct connection of system voltages to transistor gate inputs. Several considerations factor into this design constraint, including electrostatic damage (ESD) concerns.

The constraint is problematic because configuring a dummy bit line requires tying a certain number of the SRAM cells high and the remaining ones low. With direct connections to VDD (power) and VSS (ground or reference) disallowed by the design rules, an additional "tie" structure must be used for each of the standard SRAM cells on the dummy bit line. Each tie structure generally includes two transistors to make the VSS or VDD connection via drain/source paths and the corresponding consumption of real estate by the tie structures can be significant.

SUMMARY OF THE DISCLOSURE

A dummy SRAM cell for use on a dummy bit line of an SRAM circuit can be made to exhibit substantially the same bit line electrical characteristics as a (real) SRAM cell by basing the dummy SRAM cell on the same transistors and layout as the SRAM cell. For example, one method of deriving a dummy SRAM cell from an SRAM cell comprises reconfiguring metal layer connections for first transistors in the SRAM cell, such that the first transistors operate as a dummy bit line output circuit, and reconfiguring metal layer connections for second transistors in the SRAM cell, such that the second transistors operate as a voltage tie circuit for the dummy bit line output circuit.

In one configuration, the dummy bit line output circuit is configured as a bit line load, and the voltage tie circuit is configured as a tie-low circuit for coupling an input of the dummy bit line output circuit to a (logic) low voltage connection. In another configuration, the dummy bit line output circuit is configured as a bit line driver, and the voltage tie circuit is configured as a tie-high circuit for coupling an input of the dummy bit line output circuit to a (logic) high voltage connection. Such configuration changes may be made by changing metallization layer connections for the first and second transistors used in a standard (functional) SRAM cell.

One embodiment of an electronic design library includes dummy bit line load and driver configurations of the dummy SRAM cell. More generally, a dummy SRAM cell in an electronic library represents a modified version of a functional SRAM cell that is also defined in the library. The dummy SRAM cell functionally comprises a dummy bit line output circuit formed using first transistors corresponding to like first transistors in the SRAM cell, and a voltage tie circuit for tying a voltage input of the dummy bit line output circuit to a desired voltage level. The voltage tie circuit is formed using second transistors corresponding to like second transistors in the SRAM cell. For example, the second transistors used to form the voltage tie circuit would be used to form a complementary bit line output in the SRAM cell, which is not needed in the dummy SRAM cell.

One embodiment of a dummy SRAM cell, whether represented in electronic form within a design library or physically instantiated in an integrated circuit, comprises first transistors forming a dummy bit line output circuit and second transistors forming a voltage tie circuit for the dummy bit line output circuit. The first transistors correspond to like first transistors in a functional SRAM cell that form a first bit line output circuit in the functional SRAM cell, and the second transistors correspond to like second transistors in the functional SRAM cell that form at least a portion of a second bit line output circuit in the functional SRAM cell.

An SRAM circuit may be implemented using dummy SRAM cells as taught herein. In one embodiment, the SRAM circuit comprises an array of SRAM cells for storing data, read/write circuitry for providing access to the array of SRAM cells, and one or more dummy bit line circuits for timing signal generation in association with the read/write circuitry, each dummy bit line circuit including a dummy bit line and a number of dummy SRAM cells coupled to the dummy bit line.

DESCRIPTION OF EMBODIMENTS OF THE DISCLOSURE

Figure 1:
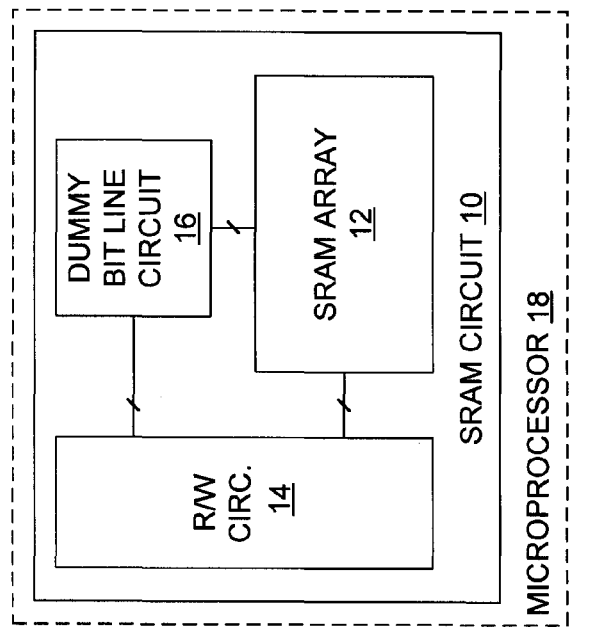
FIG. 1 is a block diagram of one embodiment of an SRAM circuit.

FIG. 1 illustrates an SRAM circuit 10 that includes an SRAM array 12, a read/write circuit 14, and one or more dummy bit line circuits 16, which are configured using dummy SRAM cell methods and apparatus taught herein. As a non-limiting example, the SRAM circuit 10 comprises an embedded memory circuit in a microprocessor 18. In other embodiments, the SRAM circuit 10 is embedded in other types of integrated circuit devices, such as an FPGA or other complex programmable logic device. In other embodiments, the SRAM circuit 10 is not embedded.

FIG. 1 illustrates the read/write circuit 14 and, more particularly, an embodiment of a dummy bit line circuit 16, separately from the SRAM array 12. It should be understood that this functional illustration provides clarity aiding discussion, and that the various elements may be implemented differently. For example, the read/write circuit 14 and the dummy bit line circuit 16 may be integrated within the SRAM array 12, which includes pluralities of SRAM array bit lines and SRAM cells.

Figure 2:
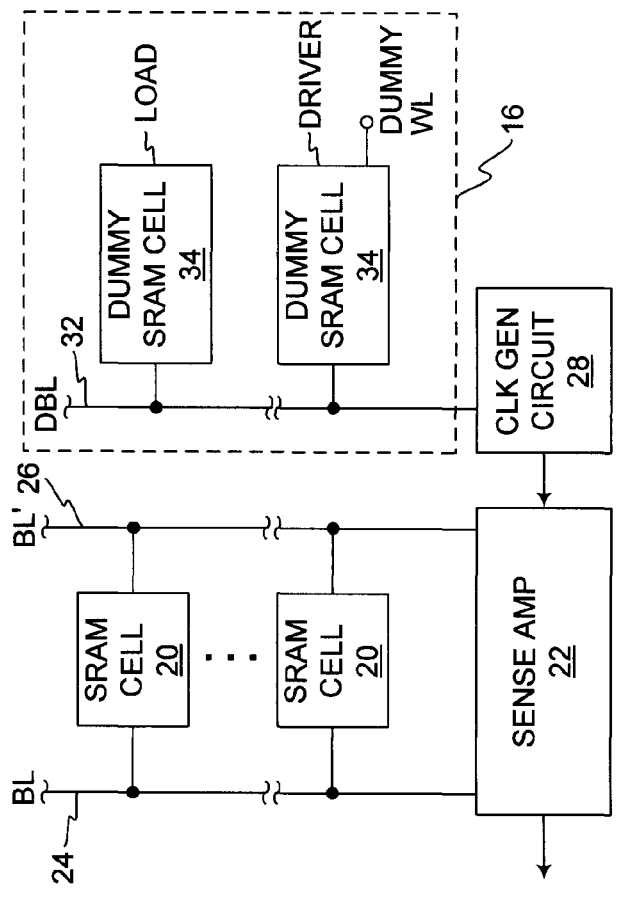
FIG. 2 is a block diagram of one embodiment of bit lines and corresponding SRAM cells, and a dummy bit line and corresponding dummy SRAM cells.

FIG. 2 illustrates one embodiment of the SRAM array 12 and dummy bit line details associated with the SRAM array 12. A column of SRAM cells 20 connect to a sense amplifier 22 via first and second bit lines 24 and 26. The sense amplifier 22 "reads" the differential voltage developed across the complementary first and second bit lines 24 and 26, which are referred to as bit lines BL and BL'. It should be understood that the SRAM array 12 may have a plurality of SRAM cell columns, respectively coupled by pairs of bit lines 24/26 to corresponding sense amplifiers 22. As a non-limiting example, the SRAM array 12 is configured to store 64-bit digital words in 64 columns of SRAM cells 20.

Sense amplifier clocking for memory read operations rely on one or more clock signals output by a clock generation circuit 28. Timing signal generation is slaved to one or more dummy bit line circuits 16, such that read timing tracks timing changes in the SRAM array 12.

As depicted in FIG. 2, one embodiment of the bit line circuit 16 comprises a dummy bit line 32 coupled to a plurality of dummy SRAM cells 34—two are shown for simplicity—which are configured as a mix of dummy bit line drivers and dummy bit line loads. Notably, the characteristics of the dummy bit line 32 are substantially the same as the real bit lines 24 and 26. Likewise, the electrical characteristics of the dummy SRAM cells 34 are substantially the same as the real SRAM cells 20—at least with respect to their bit line output characteristics. Matching the characteristics of the dummy SRAM cells 34 and the dummy bit lines 32 with those of the SRAM cells 20 and the bit lines 24/26 allows read clock timing generation to track process-temperature-voltage (PTV) changes affecting the SRAM array 12.

In one or more embodiments, the dummy bit line circuit (s) 16 are "programmable" in the sense that the dummy bit line timing delay can be adjusted. In more detail, timing delay adjustment allows control of the time delay from the assertion of a dummy bit write line to the voltage on the corresponding dummy bit line 32 falling below the trigger threshold of the clock generation circuit 28. That time delay should match/track the timing delay from the assertion of a "regular" write line in the SRAM array 12 to the corresponding BL/BL' lines falling to a level that triggers the corresponding sense amp 22. Delay timing programmability allows dummy bit line timing delay adjustments, even after the dummy SRAM circuits are fixed in silicon (or other semiconductor material).

Figure 3:
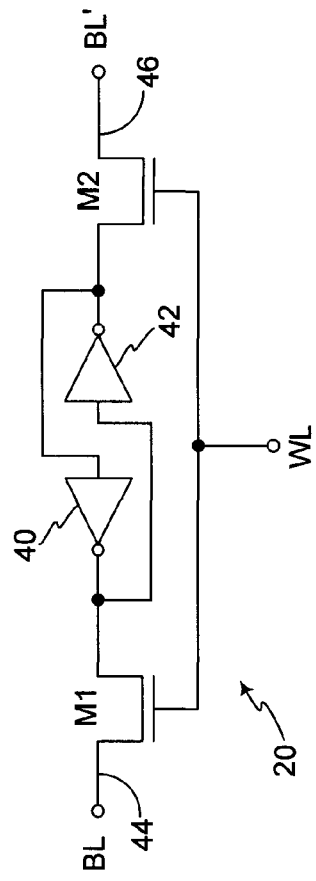
FIG. 3 is a block diagram of one embodiment of an SRAM cell.

With the above points in mind, understanding the matching and space efficiency benefits of the dummy SRAM cells 34 begins with better understanding the "regular" or "standard" SRAM cells 20 that are used as functional memory elements in the actual SRAM array 12. For example, FIG. 3 illustrates details for one embodiment of the SRAM cell 20, wherein it comprises a bit storage circuit built from a pair of back-to-back inverters 40 and 42, a first bit line output transistor M1 for coupling to the first bit line BL at a first bit line output 44, and a second bit line output transistor M2 for coupling to the complementary, second bit line BL' at a second bit line output 46. (Note that these outputs also function as inputs during writes to the SRAM cell 20.)

Figure 4:
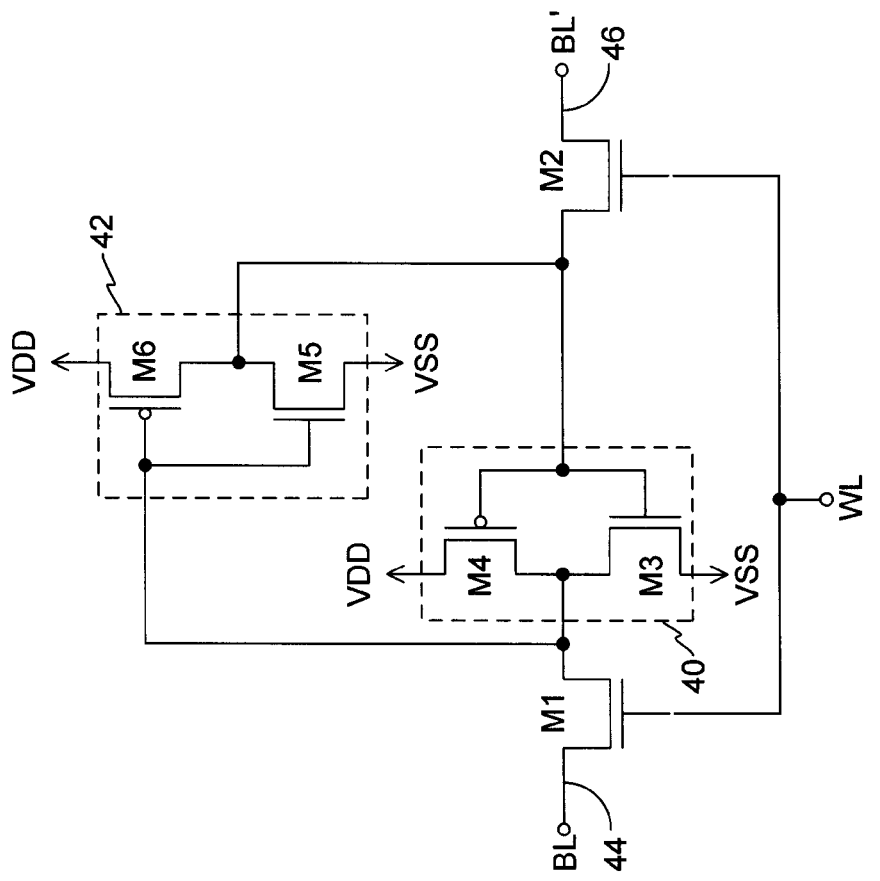
FIG. 4 is a block diagram of one embodiment of an SRAM cell.

FIG. 4 provides further details by depicting the transistor-based structure of the back-to-back inverters 40 and 42. An NFET transistor M3 and a PFET transistor M4 comprise the inverter 40, while a similar NFET/PFET pair of transistors M5 and M6 comprise the inverter 42. The NFET transistor in each inverter, M3 in inverter 40 and M5 in inverter 42, may be referred to as "pull-down" devices.

Other convenient nomenclature may be used. For example, the transistors M1, M3, and M4 may be considered as a first set of SRAM cell transistors, and the transistors M2, M5, and M6 may be considered as a second set of SRAM cell transistors. The first transistors M1, M3, and M4 are configured as a first bit line output circuit operative to drive the first bit line output 44 during a read operation. Likewise, the second transistors M2, M5, and M6 are configured as a second bit line output circuit operative to drive the second bit line output 46.

Figure 5:
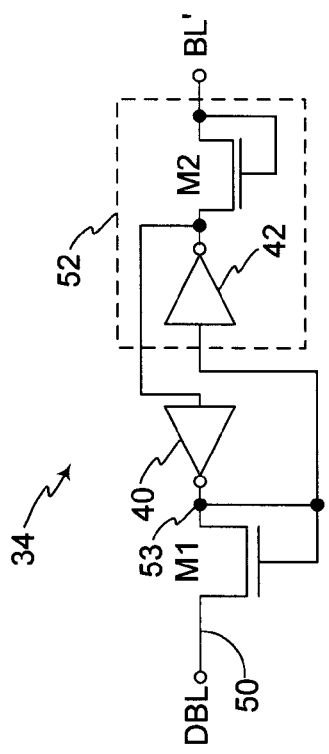
FIG. 5 is a block diagram of one embodiment of a dummy SRAM cell, configured as a dummy bit line load.
Figure 6:
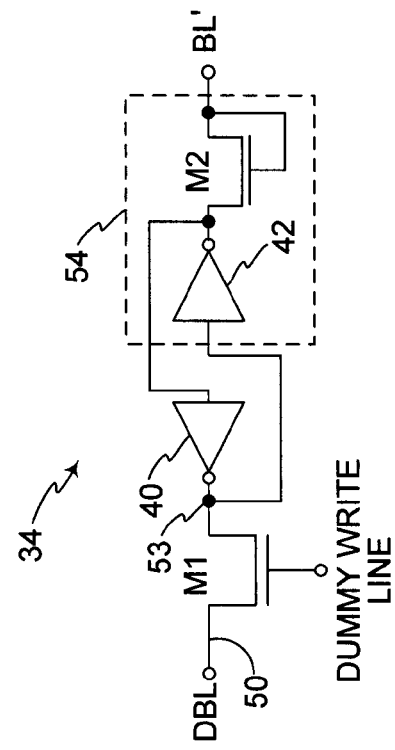
FIG. 6 is a block diagram of one embodiment of a dummy SRAM cell, configured as a dummy bit line driver.

FIGS. 5 and 6 depict different configurations of the dummy SRAM cell 34 and highlight the reconfiguring of these same transistors for use in the dummy bit line application. Specifically, FIG. 5 illustrates a dummy bit line load configuration of the dummy SRAM cell 34, while FIG. 6 illustrates a dummy bit line driver configuration. Both figures illustrate that the same basic cell structure and arrangement as used in the SRAM cell 20 can be modified to create the dummy SRAM cell 34 in a manner that yields good electrical matching with the SRAM cell 20, in terms of bit line loading/driving characteristics. Further, the dummy SRAM cell 34 yields good space efficiency as compared to using SRAM cells 20 plus separate voltage-tie circuits for dummy bit line loading and driving.

Turning to FIG. 5 in for illustration of the dummy bit line load configuration, one sees that the transistor M1 and the inverter 40—transistors M3 and M4—form a dummy bit line output circuit that is substantially identical to the bit line output circuit formed using these same transistors in the SRAM cell 20. In particular, the dummy SRAM cell 34 couples to a corresponding dummy bit line 32 using the same M1 transistor that the SRAM cell 20 uses to couple to an actual bit line 24/26. Thus, for the off-state of M1, the diffusion capacitance presented at an output 50 to a dummy bit line 32 by a dummy SRAM cell 34 is substantially the same as the diffusion capacitance presented to a bit line 24 or 26 by an SRAM cell 20. Moreover, because the dummy SRAM cell 34 and the SRAM cell 20 both use the inverter 40 to provide drain/source current for the M1 transistor, their bit line output drive characteristics are substantially the same.

However, as depicted in FIG. 5, the dummy SRAM cell 34 does not "need" the second inverter 42 (transistors M5 and M6) and the output transistor M2 of the SRAM cell 20, because it is not necessary for the dummy SRAM cell 34 to drive the complementary bit line BL', or to be driven by BL'. At least some of these "extra" transistors are used to create a voltage tie circuit 52 for the dummy bit line output circuit formed from the inverter 40 and the bit line output transistor M1.

In more detail, the BL' line shown in FIG. 5 (connected to M2) is biased to the supply voltage level VDD, and the transistor M2 is configured as a diode, which provides a static "high" input to the inverter 40. In turn, the output node 53 of the inverter 40 is held low, which keeps the transistor M1 fixed in the OFF state, such that the dummy bit line DBL "sees" the junction load of M1. Thus, in the dummy load configuration of FIG. 5, the transistor M1 remains in the off state during operation, and loads the dummy bit line 32 by virtue of M1's diffusion capacitance.

FIG. 6 depicts another configuration of the dummy SRAM cell 34, wherein it is configured as a dummy bit line driver in which the transistor M1 is gated on during operation using a DUMMY WRITE LINE signal, or other signal that is generated for accessing the SRAM array 12. In this configuration, a voltage tie circuit 54 is configured as a tie-high circuit that again uses the inverter 42 and the output transistor M2. Again, the illustrated BL' is biased to VDD, and the transistor M2 is configured as a diode, for fixing the input of the inverter 40 high, so that the output node 53 of the inverter 40 remains low. However, the gate of the output transistor M1 is tied a DUMMY WRITE LINE or other signal, which is set to a logic high during an SRAM access (read or write operation). Because of that gate connection, the transistor M1 pulls DBL to a logic low during SRAM array read/write operations—i.e., it loads the DBL line.

In the above examples, the dummy SRAM cell 34 in its different configurations makes use of the same transistors as used in the SRAM cell 20. More particularly, the SRAM cell 20 includes first and second subsets of transistors configured as first and second bit line output circuits. The dummy SRAM cell 34 includes the same first and second subsets of transistors, with the first transistors configured as a dummy bit line output circuit having substantially the same electrical characteristics as the first bit line output circuit of the standard SRAM cell 20. Further, the second transistors, which are not otherwise needed for the dummy SRAM cell function, are reconfigured as a voltage tie circuit for the dummy bit line output.

Using the second transistors for this purpose obviates the need for adding additional transistors to form the voltage tie circuits needed to fix the dummy SRAM cell 34 as a load or driver. (As noted earlier herein, process-related design rules may prohibit directly attaching transistor gates to voltage rails, meaning that transistor-based tie circuits are needed to make VDD/VSS connections to transistors gates.)

As for the load and driver configurations of the dummy SRAM cell 34, it should be understood that a mix of both configurations would be coupled to a dummy bit line (DBL) 32 in common dummy bit line circuit implementations. That is, one would define the mix of driving and loading dummy SRAM cells 34 as a function of the read timing requirements. For a given total number of dummy SRAM cells 34 coupled to a given dummy bit line 32, configuring a greater (or lesser) number of them as dummy bit line drivers yield faster (or slower) dummy bit line charge/discharge times.

Figure 7:
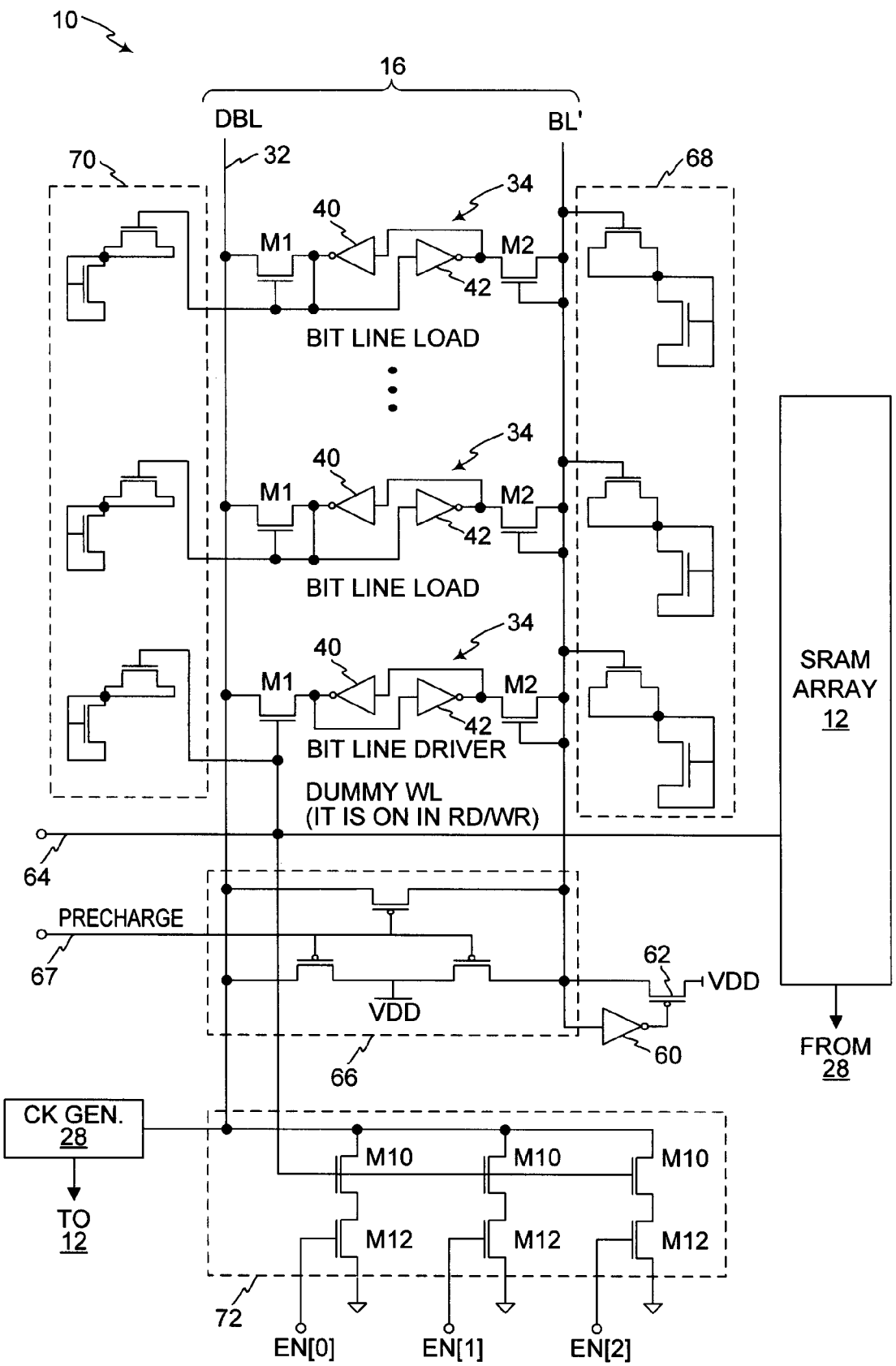
FIG. 7 is a block diagram of one embodiment of an SRAM array and a corresponding dummy bit line circuit.

FIG. 7 illustrates an embodiment of the SRAM circuit 10, wherein a dummy bit line circuit 16 is used to control clock generation timing for the SRAM array 12. As will be detailed, the illustrated dummy bit line circuit includes one dummy SRAM cell 34 configured as a dummy bit line driver, which matches conditions in embodiments of the SRAM array 12 where only one SRAM cell 20 per bit line is "on" during an SRAM read.

Turning to the illustrated circuit details, one sees an inverter 60 and transistor 62 used to bias the dummy bit line circuit's BL' line to VDD, such that the voltage-tie circuits 52 and 54 of FIGS. 5 and 6, respectively, are properly biased for setting one or more dummy SRAM cells 34 as bit line loads, and one or more of them as bit line drivers. Further, one sees the use a DUMMY WL or R/WL 64 to drive the dummy SRAM cells 34 that are configured as dummy bit line drivers. The illustration further depicts the use of a pre-charge circuit 66 and corresponding pre-charge signal line 67, which provides timing input to the clock generation circuit 28, based on the dummy bit line timing characteristics. (One also sees the use of edge transistor circuits 68 and 70, for isolating the dummy bit line circuit 16.)

Additionally, regarding the delay timing programmability mentioned earlier herein, FIG. 7 illustrates one embodiment of a programmable delay control circuit 72 comprising three pairs of stacked pull-down transistors M10 and M12. The bottom M12 transistor in each pair is gated by one bit in a three-bit digital control signal EN[0,1,2] and the top M10 transistor in each pair is gated by the DUMMY WL signal or other coordinated array access signal. Thus, the dummy SRAM cell 34 that is configured as a dummy bit line load pulls down the dummy bit line 32 when DUMMY WL is asserted, and an additional "amount" of pull-down loading is added by the programmable delay control circuit 72.

In more detail, the DUMMY WL (or other coordinated SRAM array access signal) turns on the M1 bit line output transistor in the bit line driver dummy SRAM cell 34, and turns on the top M10 transistor in each M10/M12 transistor pair within the programmable delay control circuit 72. With the M10 transistors biased on via the DUMMY WL signal, each individual M10/M12 transistor pair is enabled or disabled as a pull-down "helper" by the corresponding enable signal bit. For example, setting EN[0] high and EN[1], EN[2] low, would turn on one of the three pull-down pairs M10/M12.

In one or more embodiments, the transistors of the programmable delay control circuit 72 comprises "scaled" versions of transistors used in the SRAM cells 20/dummy SRAM cells 34. For example, in one embodiment, the transistor M10 of the programmable delay control circuit 72 is an integer scaling of the bit line output transistor M1, such as shown in FIG. 4. That is, in terms of transistor geometries, M10=N×M1, where N represents a desired scaling factor. Similarly, the transistor M12 of the programmable delay control circuit 72 is, in one or more embodiments, implemented as a scaled version of the transistor M3 illustrated, for example, in FIG. 4. Thus, M12=R×M3, where R represents a desired scaling factor and where R=N in at least some embodiments.

With the transistor scaling of the programmable delay control circuit 72, the dummy bit line delay time is controlled by programming the programmable delay control circuit 72, which is configured to act as current source. The current source equals an integer number of the read current of an SRAM cell 20. Thus, the delay time of the dummy bit line 32 is set by the current sourcing capability of the one dummy SRAM cell 34 that is configured as the dummy bit line driver, and the current sourcing capability of enabled pairs of the M10/M12 transistors in the programmable delay control circuit 72.

The above approach matches the electrical behavior of the transistors M10 and M12 to the electrical behavior of the transistors M1 and M3 of the SRAM cells 20. Delay timing of the dummy bit line circuit 16 thus can be adjusted as needed or desired by controlling the bit pattern of the EN[0,1,2] signal, i.e., the pull-down transistor pairs are digitally addressable elements. Of course, fewer or greater numbers of pull-down circuits can be used to yield a wider programmability range, and other types of programmable delay timing controls could be used, e.g., analog controlled bias circuits, etc.

Regardless of these details, those skilled in the art will understand that both configurations of the dummy SRAM cell 34 (load or driver) can be implemented in an electronic design library, to allow an SRAM designer to instantiate the loading and driving configurations as needed. Similarly, macro structures, such as whole dummy bit line circuits 16, or SRAM arrays 12 with integrated dummy bit line circuits 16, may be implemented for use with any number of electronic design tools.

Figure 8:
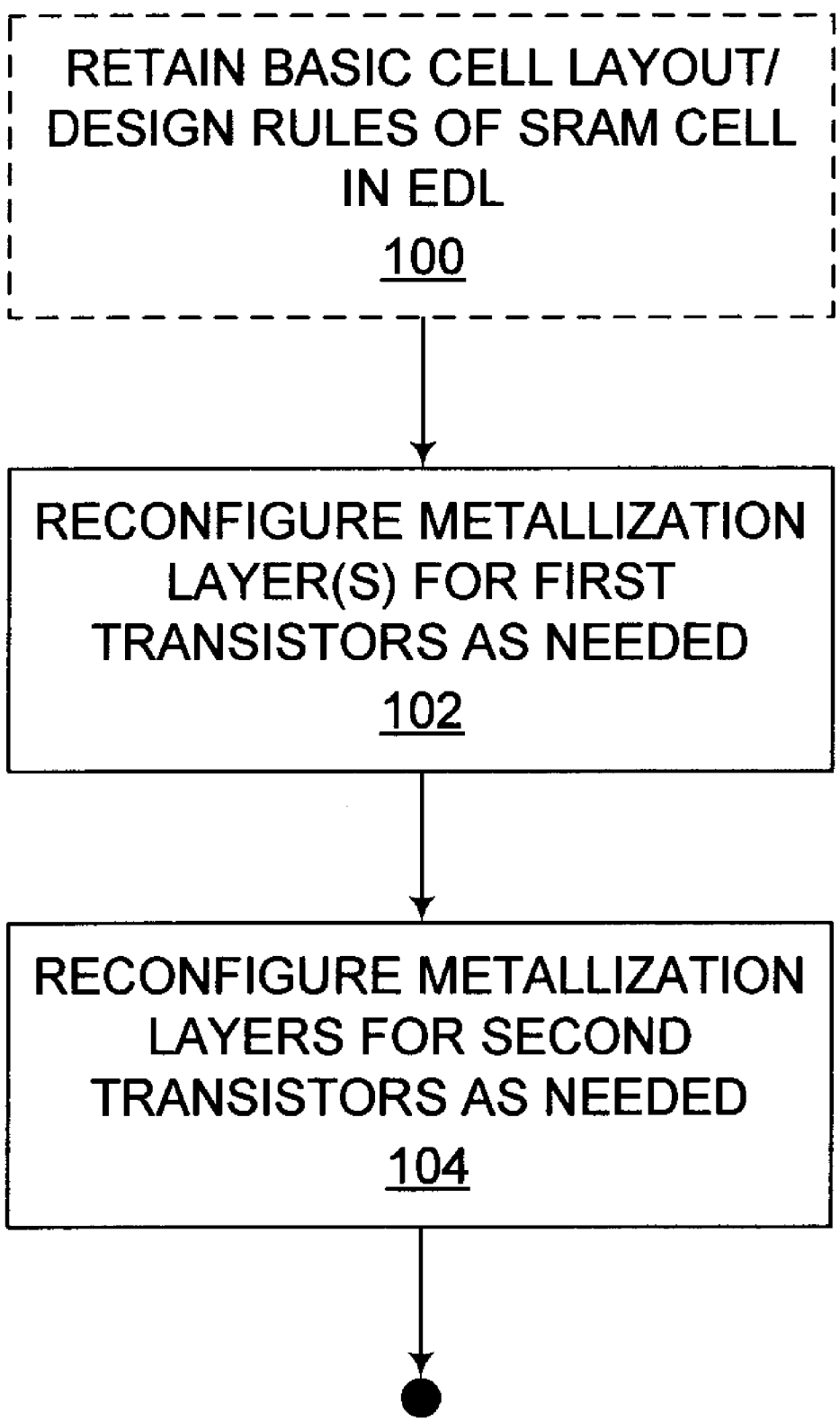
FIG. 8 is a logic flow diagram of one embodiment of a method of implementing a dummy SRAM cell in an electronic design library.

Regardless of how the dummy SRAM cell 34 is implemented electronically, or instantiated in a physical circuit, FIG. 8 illustrates a method of reconfiguring an SRAM cell 20 for use as a dummy SRAM cell 34. The method "begins" by copying the SRAM cell 20, retaining the basic cell layout and electronic design rule constraints of the SRAM cell 20 (Step 100). In this context, design rule constraints may, for example, include metallization layer widths/thicknesses, transistor device characteristics (geometries, doping, oxide thicknesses, etc.), and other design parameters.

The method continues by minimally changing the metallization layer connections for the M1, M3, and M4 transistors—referred to as first transistors—of the SRAM cell 20, such that they function as a dummy bit line output circuit that exhibits substantially the same characteristics as the bit line output circuit formed by the same transistors in the actual SRAM cell 20 (Step 102). The method continues further by changing the metallization layer connections as needed for the M2, M5, and M6 transistors—referred to as second transistors—of the SRAM cell 20, such that at least some of them function as a voltage tie circuit 52 or 54, rather than as the second bit line output circuit formed by the same transistors in the actual SRAM cell 20 (Step 104).

One or more of the embodiments described and illustrated relate to a six-transistor SRAM cell 20, which is reconfigured to function as a dummy SRAM cell 34. Those skilled in the art will appreciate that other standard SRAM cell architectures also may be reconfigured as dummy SRAM cells according to the methods and apparatus taught herein, including those with a greater or lesser number of transistors. As such, those skilled in the art will appreciate that the present invention is not limited by the discussion herein relating to various illustrative embodiments, nor is it limited by the accompanying figures. Rather, the present invention is limited only by the following claims, and their legal equivalents.

The invention claimed is:

1. A dummy SRAM cell for use on a dummy bit line of an SRAM circuit, the dummy SRAM cell comprising:
   first transistors configured as a dummy bit line output circuit and corresponding to like first transistors in a functional SRAM cell that are configured as a first bit line output circuit in the functional SRAM cell; and
   second transistors configured as a voltage tie circuit for the dummy bit line output circuit and corresponding to like second transistors in the functional SRAM cell that are configured as at least part of a second bit line output circuit in the functional SRAM cell.

2. The dummy SRAM cell of claim 1, wherein the voltage tie circuit comprises a tie-low circuit coupling a logic low voltage rail to a transistor gate input of the dummy bit line output circuit, for configuring the dummy bit line output circuit as a dummy bit line load.

3. The dummy SRAM cell of claim 1, wherein the voltage tie circuit comprises a tie-high circuit coupling a logic high voltage rail to a transistor gate input of the dummy bit line output circuit, for configuring the dummy bit line output circuit as a dummy bit line driver.

4. The dummy SRAM cell of claim 1, wherein metal layer interconnections between the first transistors of the dummy SRAM cell comprise substantially the same metal layer interconnections existing between the like first transistors of the functional SRAM cell, and wherein metal layer interconnections between the second transistors of the dummy SRAM cell comprise changed metal layer interconnections relative to the like second transistors of the functional SRAM cell, such that the second transistors of the dummy SRAM cell function as the voltage tie circuit for the dummy bit line output circuit rather than as the second bit line output circuit of the functional SRAM cell.

5. An SRAM circuit comprising:
   an array of SRAM cells for storing data;
   read/write circuitry for providing access to the array of functional SRAM cells; and
   one or more dummy bit line circuits for timing signal generation in association with the read/write circuitry, each dummy bit line circuit including a dummy bit line and a number of dummy SRAM cells coupled to the dummy bit line, each said dummy SRAM cell comprising:
      first transistors configured as a dummy bit line output circuit and corresponding to like first transistors in a functional SRAM cell that are configured as a first bit line output circuit in the functional SRAM cell; and
      second transistors configured as a voltage tie circuit for the dummy bit line output circuit and corresponding to like second transistors in the functional SRAM cell that are configured as at least part of a second bit line output circuit in the functional SRAM cell.

6. The SRAM circuit of claim 5, further comprising a microprocessor that includes the SRAM circuit as embedded memory.

7. The SRAM circuit of claim 5, wherein the number of dummy SRAM cells comprise one dummy SRAM cells configured as a dummy bit line driver, and one or more dummy SRAM cells configured as dummy bit line loads.

8. The SRAM circuit of claim 7, wherein the dummy bit line circuit includes a programmable delay control circuit that is configured to provide delay timing adjustment for the dummy bit line circuit.

9. The SRAM circuit of claim 8, wherein the programmable delay control circuit comprises digitally addressable, parallel pull-down elements, such that none, one, or more parallel pull-down elements can be enabled in conjunction with enabling the one or more dummy bit line drivers.

10. The SRAM circuit of claim 9, wherein the parallel pull-down elements of the programmable delay control circuit comprise scaled versions of one or more transistors used in the SRAM cells.

11. A dummy SRAM cell in an electronic design library, the dummy SRAM cell representing a modified version of a standard SRAM cell that is defined in the electronic design library, said dummy SRAM cell comprising:
   a dummy bit line output circuit configured using first transistors corresponding to like first transistors in the standard SRAM cell; and
   a voltage tie circuit for tying a voltage input of the dummy bit line output circuit to a desired voltage signal, said voltage tie circuit configured using second transistors corresponding to like second transistors in the standard SRAM cell.

12. A method of deriving a dummy SRAM cell from a standard SRAM cell, such that the dummy SRAM cell exhibits substantially similar electrical characteristics as the standard SRAM cell in terms of bit line loading, the method comprising:
   reconfiguring metal layer connections for first transistors in the standard SRAM cell, such that the first transistors operate as a dummy bit line output circuit; and
   reconfiguring metal layer connections for second transistors in the standard SRAM cell, such that the second transistors operate as a voltage tie circuit for the dummy bit line output circuit.

13. The method of claim 12, wherein reconfiguring metal layer connections for the first transistors comprises reconfiguring the metal layer connections to configure the dummy bit line output circuit as a dummy bit line load, and wherein reconfiguring metal layer connections for the second transistors comprises reconfiguring the metal layer connections to configure the voltage tie circuit as a tie-low circuit for coupling an input of the dummy bit line load to a low voltage rail.

14. The method of claim 12, wherein reconfiguring metal layer connections for the first transistors comprises reconfiguring the metal layer connections to configure the dummy bit line output circuit as a dummy bit line driver, and wherein reconfiguring metal layer connections for the second transistors comprises reconfiguring the metal layer connections to configure the voltage tie circuit as a tie-high circuit for coupling an input of the dummy bit line load to a high voltage rail.

* * * * *